(12) United States Patent
Baluswamy et al.

(10) Patent No.: US 6,803,157 B2
(45) Date of Patent: Oct. 12, 2004

(54) PATTERN MASK WITH FEATURES TO MINIMIZE THE EFFECT OF ABERRATIONS

(75) Inventors: Pary Baluswamy, Boise, ID (US); William A. Stanton, Boise, ID (US); William J. Baggenstoss, Boise, ID (US)

(73) Assignee: Micron Technology, Inc., Boise, ID (US)

(*) Notice: Subject to any disclaimer, the term of this patent is extended or adjusted under 35 U.S.C. 154(b) by 145 days.

(21) Appl. No.: 10/090,073

(22) Filed: Mar. 1, 2002

(65) Prior Publication Data

US 2003/0165748 A1 Sep. 4, 2003

(51) Int. Cl.[7] .................................................. G03F 9/00
(52) U.S. Cl. ........................................................... 430/5
(58) Field of Search ................................ 430/5; 378/34, 378/35

(56) References Cited

U.S. PATENT DOCUMENTS

| | | | |
|---|---|---|---|
| 5,932,491 A | 8/1999 | Wald et al. | 438/734 |
| 6,114,095 A * | 9/2000 | Nakabayashi et al. | 430/5 |
| 6,120,952 A | 9/2000 | Pierrat et al. | 430/30 |
| 6,144,109 A | 11/2000 | Stanton et al. | 257/797 |
| 6,214,497 B1 | 4/2001 | Stanton | 430/5 |
| 6,238,824 B1 | 5/2001 | Futrell et al. | 430/5 |
| 6,242,816 B1 | 6/2001 | Stanton et al. | 257/797 |
| 6,245,468 B1 | 6/2001 | Futrell et al. | 430/5 |
| 6,258,489 B1 | 7/2001 | Stanton et al. | 430/5 |
| 6,284,419 B2 | 9/2001 | Pierrat et al. | 430/30 |
| 6,319,644 B2 | 11/2001 | Pierrat et al. | 430/30 |
| 2001/0002304 A1 | 5/2001 | Pierrat et al. | 430/30 |
| 2001/0023043 A1 | 9/2001 | Futrell et al. | 430/5 |
| 2001/0023045 A1 | 9/2001 | Pierrat et al. | 430/30 |
| 2001/0033979 A1 | 10/2001 | Baggenstoss | 430/5 |

OTHER PUBLICATIONS

Peterson, J.S., "Analytical Description of Anti–scattering and Scattering Bar Assist Features," Proceedings of SPIE: Optical Microlithography XIII, vol. 4000, pp. 77–89 (Mar. 1–3, 2000).

\* cited by examiner

Primary Examiner—Saleha R. Mohamedulla
(74) Attorney, Agent, or Firm—Fish & Neave; Jeffrey H. Ingerman

(57) ABSTRACT

A semiconductor pattern mask that might otherwise exhibit three-fold symmetry, which could give rise to distorted semiconductor features in the presence of three-leaf aberration in the optical system used to expose a semiconductor wafer through the mask, is altered to break up the three-fold symmetry without altering the semiconductor features that are formed. This accomplished by adding features to the mask that break up the symmetry. One way of achieving that result is to make the added features of "sub-resolution" size that do not produce features on the exposed wafer. Another way of achieving that result is to change existing features that do form structures in such a way (e.g., with optical elements) that changes the relative phase, amplitude or other characteristic of light transmitted through those features.

10 Claims, 5 Drawing Sheets

PATTERN MASK WITH FEATURES TO MINIMIZE THE EFFECT OF ABERRATIONS

BACKGROUND OF THE INVENTION

This invention relates to a semiconductor pattern mask having features to minimize aberrations. More particularly, this invention relates to a semiconductor pattern mask having sub-resolution features to reduce the sensitivity of the pattern to aberrations in the optics of the pattern imaging system.

Semiconductor devices are typically manufactured using photolithographic techniques. The circuit elements or structures to be formed are drawn on a mask. The mask can be a "dark field layout" in which the circuit elements are represented by light-transmissive areas on a nontransmissive (or less transmissive) background, or a "clear field layout" in which the circuit elements are represented by nontransmissive (or less transmissive) areas on a transmissive background.

A silicon substrate, suitably doped, is provided with a photosensitive coating or "photoresist." The photosensitive coating is exposed to light through the mask using an optical system, and is then processed to develop the circuit elements on the silicon substrate. The process is repeated for multiple layers of silicon and metallization (using a different mask for each layer) until the desired circuit has been formed.

The optical elements in the optical system used to expose the photosensitive surface through the mask may be imperfect. For example, lenses in that system may be manufactured with one of several optical aberrations.

One such aberration, known as three-leaf aberration, may cause distortion of the imaging of the mask features onto the photosensitive surface, resulting in corresponding distortions in the final semiconductor device.

It would be desirable to be able to provide a way to eliminate the sensitivity of semiconductor pattern mask to three-leaf aberration.

SUMMARY OF THE INVENTION

Preferably, in accordance with the present invention, a semiconductor pattern mask includes first features intended to form structures in the semiconductor end product, and second features that differ from such first features in a way that breaks up three-fold symmetry in the pattern, and may or may not form structures in the semiconductor end product. The latter features may be of different transmissivity than the former features, which results in breaking up the three-fold symmetry. In one embodiment, the differing transmissivity is a result of a difference in the size of the features, with additional features being smaller than the features intended to form structures. The smaller features are not intended to form structures, but still are large enough to affect the pattern of transmitted light. In another embodiment, certain features may transmit light at a relative phase different than that of the light transmitted by other features. The certain features may be of substantially the same size as the other features, both of which being intended to form structures in the semiconductor end product, or the certain features may be smaller than the other features, and not intended to form structures in the semiconductor end product.

BRIEF DESCRIPTION OF THE DRAWINGS

The above and other objects and advantages of the invention will be apparent upon consideration of the following detailed description, taken in conjunction with the accompanying drawings, in which like reference characters refer to like parts throughout, and in which.

DETAILED DESCRIPTION OF THE INVENTION

Figure 2:
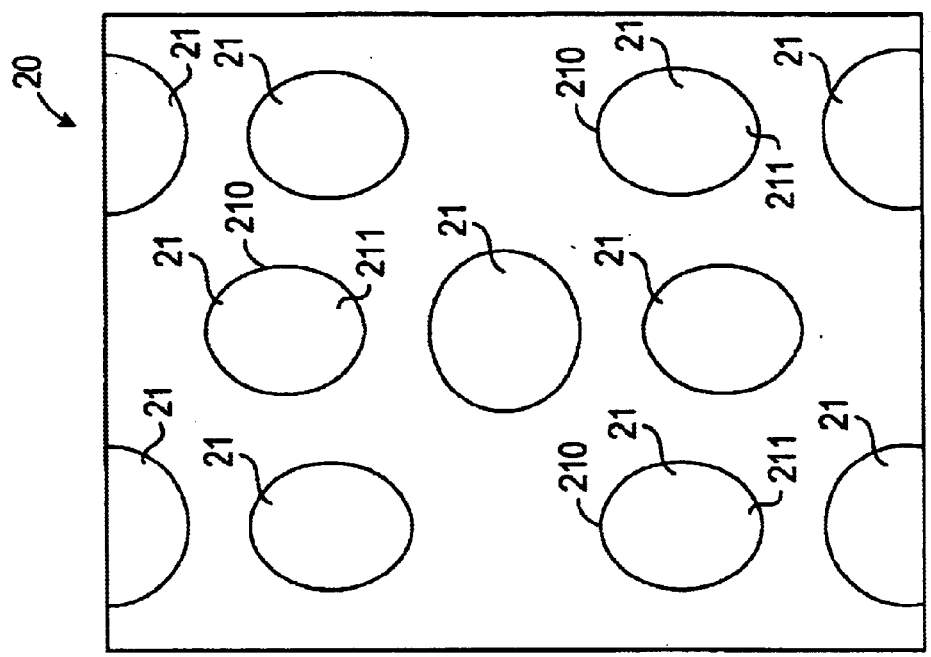
FIG. 2 is a plan view of the light pattern expected to be transmitted by the mask of FIG. 1 to a photosensitive semiconductor wafer surface.

The features on a semiconductor pattern mask are small enough that when light passes through the mask, diffraction occurs at the locations of the features. This is generally the case whether the mask is a dark-field mask, in which case the diffraction occurs as light passes through the relatively small openings that represent features in the final semiconductor, or a clear-field mask, in which case diffraction occurs around the edges of the relatively small nontransmissive areas that represent features in the final semiconductor.

The light that passes through a semiconductor pattern mask is directed via suitable optics, including lenses, onto the photosensitive surface of a semiconductor substrate. Certain optical defects in those lenses may give rise to aberrations that distort the image formed by the light on the substrate surface, and therefore distort the features formed on the semiconductor. The defects may affect only a portion of a lens, so that not all light passing through that lens is distorted, but only light that happens to pass through the affected portion. Moreover, not every lens in the system, even among lenses manufactured at substantially the same time and place, will have the defect in the same place, if at all. Therefore, the pattern of the mask cannot be "pre-distorted" so that the "distorted" image is actually the desired image, because the distortion in the optical system may be different for each piece of equipment with which identical masks are used.

As discussed above, one such aberration is known as "three-leaf aberration." Three-leaf aberration is known to cause distortion in images formed from masks having three-fold symmetry.

Thus, masks that have a substantially uniform distribution of features, even if not all of those features are identical in size or transmissivity, are substantially unaffected by three-leaf aberration. Similarly, masks that are nonuniform, but whose features are substantially spaced apart from one another, are substantially unaffected by three-leaf aberration.

The types of masks, then, that are affected are those with dense, nonuniform patterns. For example, a dense pattern having features arranged in groups of three would have three-fold symmetry and be subject to three-leaf aberration.

In accordance with the present invention, the effects of three-leaf aberration can be eliminated for such a mask by making it appear that the mask is one having a dense uniform pattern. That can be achieved by providing on the mask, in locations where there would otherwise be no features, features that are too small to form features on the semiconductor substrate. Nevertheless, these "sub-resolution" features, properly sized as discussed below, are large enough to affect the diffraction pattern and to break the three-fold symmetry of the mask.

Thus, in a dark-field mask having groups of, e.g., three openings on an opaque background, separated by areas of opaque background of sizes on the same order as the openings, small openings could be provided in those background areas to break up the three-fold symmetry and avoid three-leaf aberration. Similarly, in a clear-field mask having groups of, e.g., three dark areas on a transmissive background, separated by areas of transmissive background of sizes on the same order as the dark areas, small dark areas could be provided in those background areas to break up the three-fold symmetry and avoid three-leaf aberration. These small areas, properly sized as discussed below, are large enough to break the three-fold symmetry, but small enough that they do not produce features on the semiconductor substrate.

Instead of providing small openings or small dark areas, it is possible to alter some of the mask features intended to form structures on the semiconductor wafer, so that they differ in transmissivity from unaltered mask features in a way that breaks up the three-fold symmetry of the mask. For example, the mask features to be altered could be formed in such a way that they transmit light with a different relative phase as compared to the unaltered mask features. Both altered and unaltered mask features in this embodiment would form structures on the semiconductor wafers, but the three-fold symmetry susceptible to three-leaf aberration would be broken. One way of doing this in a dark-field mask, for example, where the mask features may be simple openings, is to provide, in each opening whose transmissivity is to be altered, a lens, filter or other optical element that changes the relative phase of light passing through it. Alternatively, the quartz plate normally present behind the mask can be etched, in the areas behind the openings whose transmissivity is to be changed, in such a way as to change the relative phase of light passing through those openings.

In another embodiment, instead of altering transmissivity by altering phase, the amplitude or intensity of the transmitted light could be altered. Thus, in a dark-field mask, the openings whose transmissivity is to be altered could be provided with optical elements that reduce the amplitude or intensity of light transmitted, while in a clear-field mask, the dark areas whose transmissivity is to be altered could be lightened to increase the amplitude or intensity of transmitted light. Again, at least in the dark-field case, the quartz plate behind the mask could be darkened in the areas where transmissivity is to be altered so as to reduce the intensity or amplitude of transmitted light.

It should also be noted that the provision of some structure to affect the phase of transmitted light can be combined with the use of smaller—i.e., sub-resolution—features as described above. The only requirement is that the resulting transmitted light not result in the formation of any structure on the semiconductor wafer, while still being sufficient to break up the three-fold symmetry of the mask pattern, which in turn avoids the effects of three-leaf aberration.

The invention will now be described with reference to FIGS. 1–9.

Figure 1:
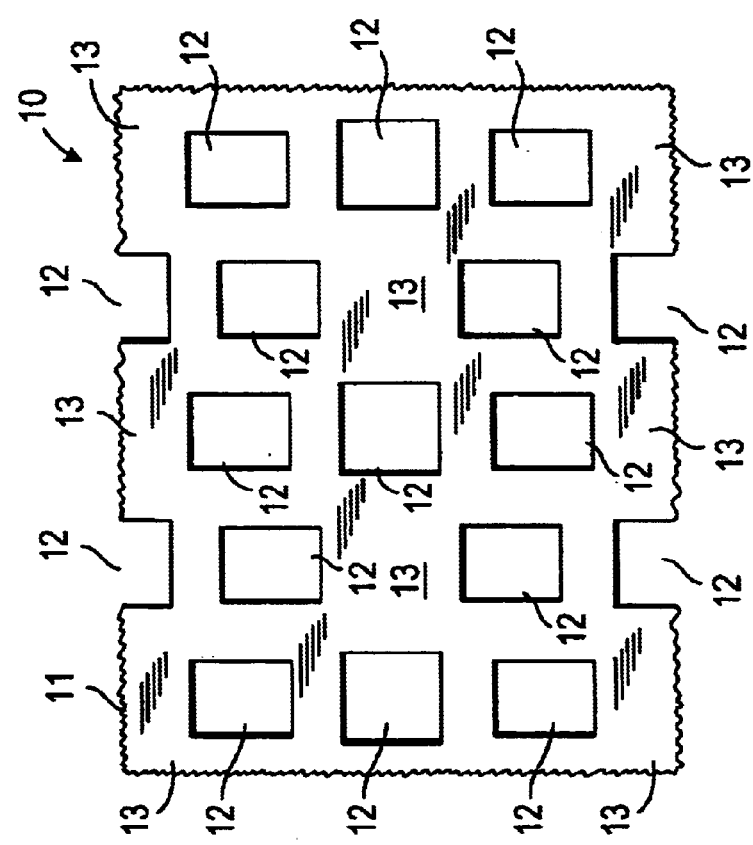
FIG. 1 is a plan view of a portion of semiconductor pattern mask that is susceptible to three-leaf aberration.

FIG. 1 shows a portion of a semiconductor pattern mask 10 that is susceptible to three-leaf aberration. Mask 10 as depicted represents a contact layer of a multi-layer semiconductor, and embodies a dark-field layout, described above, preferably having a background 11 of a first, lower transmissivity, and feature openings 12 in background 11, each preferably having a second transmissivity higher than the first transmissivity. Note that the pattern shown on mask 10 has three-fold symmetry, being made up of groups of three openings 12 separated by areas 13 of background 11.

FIG. 2 shows the pattern 20 of light intended to be transmitted by mask 10 onto a semiconductor wafer. The pattern shown is in fact the pattern transmitted in the absence of three-leaf aberration. As shown, each feature opening 12 forms a substantially circular image 21. The effects of three-leaf aberration on pattern 20 can be seen in FIG. 3, where one or more images 31 of pattern 30 is distorted as compared to corresponding images 21 of pattern 20. In particular, each image 310 as depicted is elongated in the vertical direction at 311 as compared with a corresponding image 210 at 211 in FIG. 2.

Figure 4:
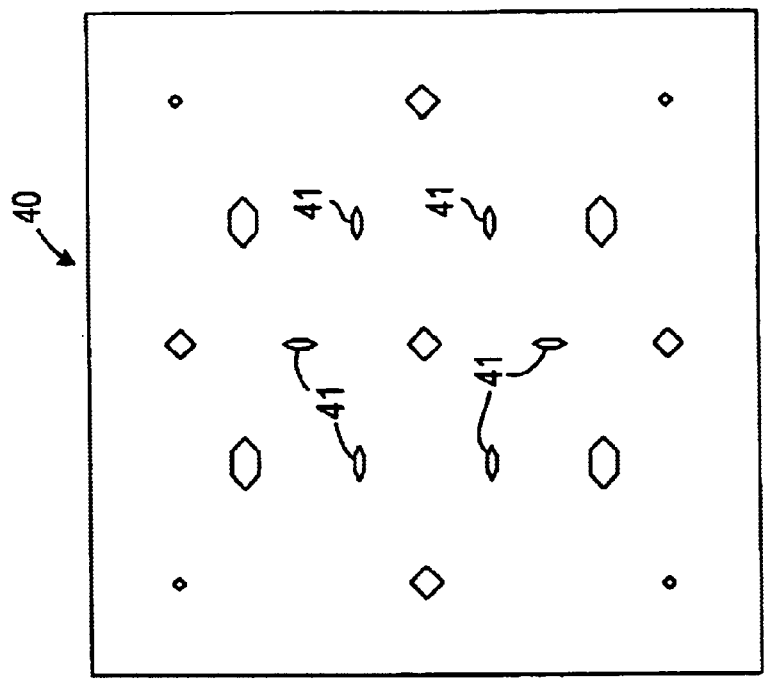
FIG. 4 is a plan view of the diffraction pattern transmitted by the mask of FIG. 1.
Figure 3:
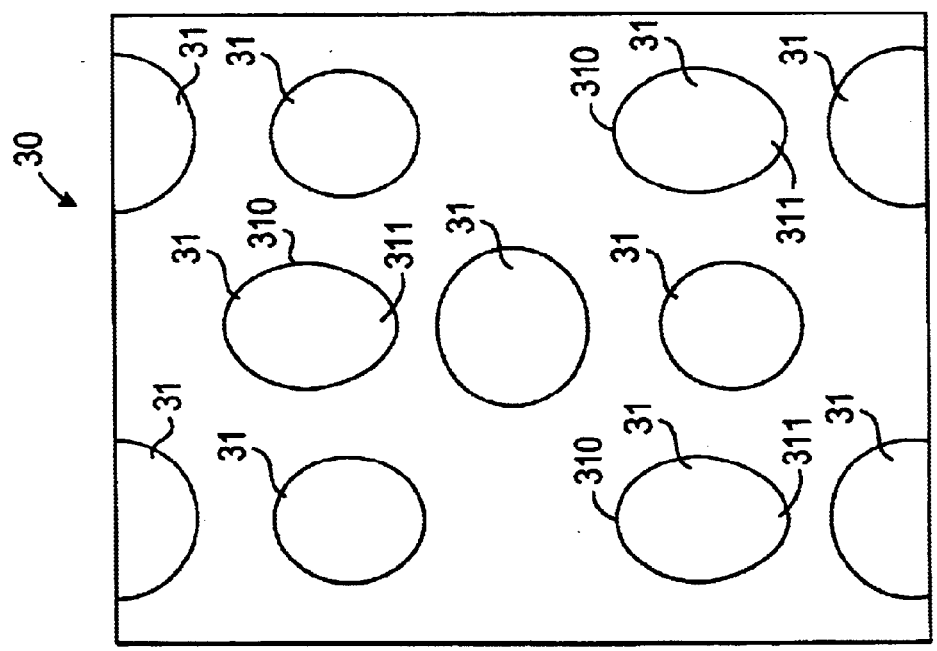
FIG. 3 is a plan view of the light pattern actually transmitted by the mask of FIG. 1 in the presence of three-leaf aberration.

As explained above, the distortion effects visible in FIG. 3 result from the presence of three-fold symmetry in pattern 20. FIG. 4 shows the diffraction pattern 40 produced by pattern 20, in which features 41 are the result of three-fold symmetry.

Figure 5:
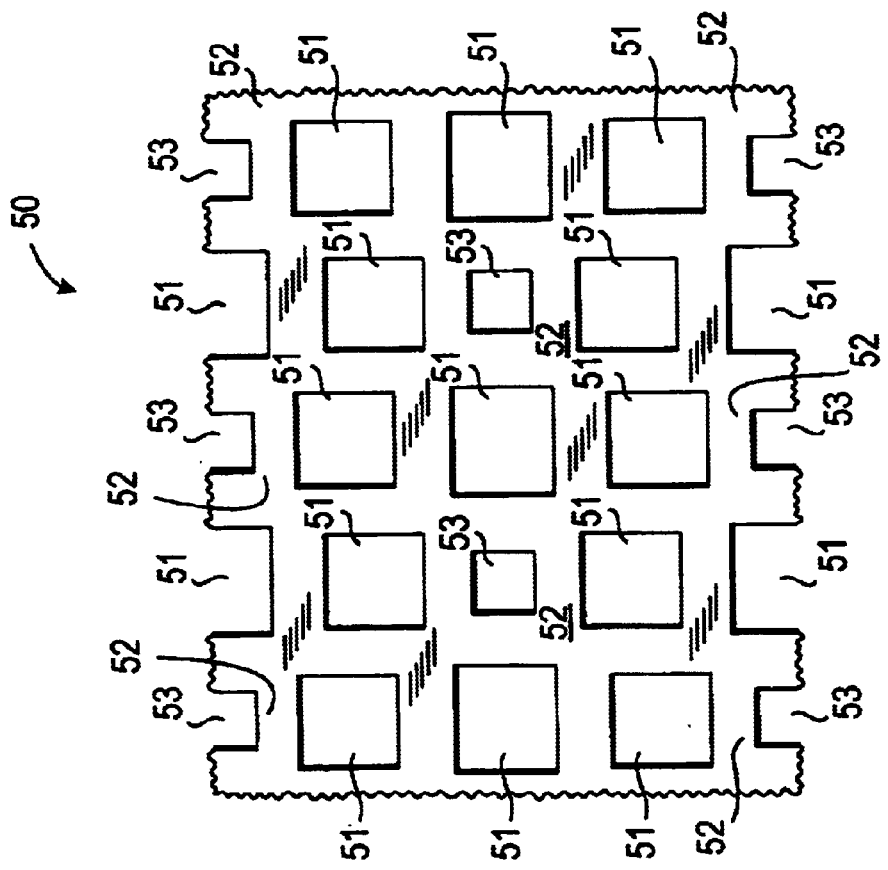
FIG. 5 is a plan view of one preferred embodiment of a semiconductor pattern mask according to the present invention.

In accordance with one preferred embodiment of the present invention, a modified pattern mask 50 may be provided, as shown in FIG. 5, to form the pattern that mask 10 is intended to form. Mask 50 preferably includes openings 51 similar to openings 11, similarly spaced and grouped, but in areas 52, where mask 10 has empty dark areas, mask 50 preferably has sub-resolution openings 53—i.e., as explained above, openings that are sufficiently smaller than openings 51 that they do not result in the formation of structures on a semiconductor wafer that is exposed through mask 50.

For example, in one embodiment, the dimensions of the center opening 51 in each group of three openings 51 are preferably about 200 nm (horizontal dimension) by about 210 nm (vertical dimension), and the dimensions of the upper and lower openings 51 in each group of three openings 51 are preferably about 190 nm (horizontal dimension) by about 215 nm (vertical dimension). In an embodiment in which such a mask is exposed using deep-ultraviolet light at a wavelength of 248 nm (such as might be provided by a krypton fluoride excimer laser), if the numerical aperture of the system were about 0.70, using annular illumination with an outer value of about 0.8 and inner value of about 0.5, the minimum dimensions of the smaller, sub-resolution areas preferably would be between about 70 nm and about 80 nm, below which they might have some effect, but would not have a sufficiently significant effect in breaking up the three-fold symmetry and correcting for the aberration, and the maximum dimensions would be about 150 nm, above which they may no longer be sub-resolution, and might start producing features on the substrate. The preferred dimensions in this particular embodiment are between about 100 nm and about 150 nm.

Generally, for systems in which the numerical aperture is between about 0.70 and about 0.80, the dimensions of the sub-resolution features preferably would be between about one-third and about one-half of the wavelength used. As the numerical aperture increases, the dimensions decrease. Therefore, if one were to develop a system having a lens with a numerical aperture greater than 0.8, the dimensions of the sub-resolution features might be less than one-third of the wavelength. Many factors affect the dimensions of the sub-resolution features for a particular system, including wavelength, numerical aperture, size of the mask features intended to form features on the substrate, transmissivity of the mask, etc. Therefore, while as a rule of thumb one might expect the dimensions of the sub-resolution features to be between about one-third and about one-half of the wavelength, every system will be different. However, one of ordinary skill will be able to determine the appropriate dimensions with minimal experimentation.

Figure 6:
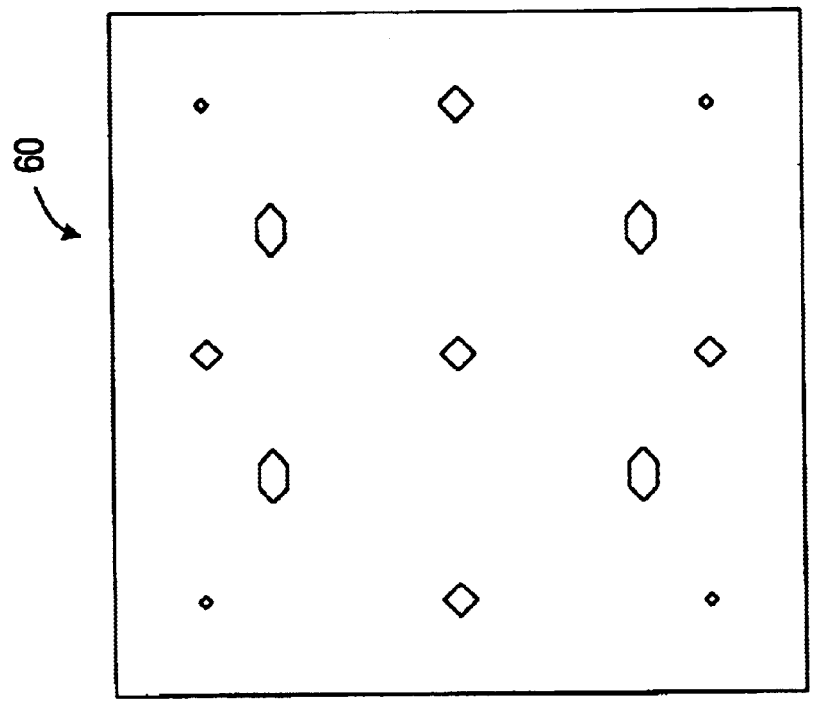
FIG. 6 is a plan view of the diffraction pattern transmitted by the mask of FIG. 5.
Figure 7:
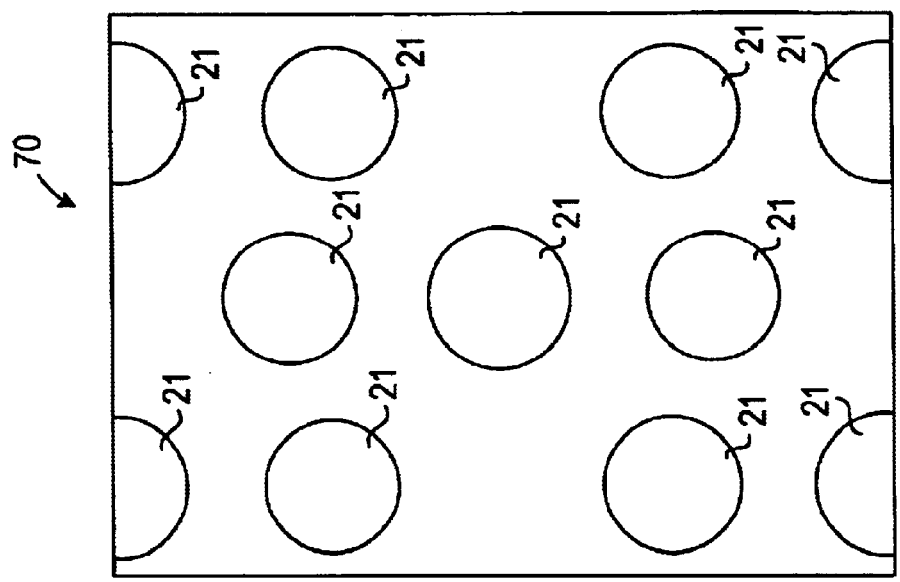
FIG. 7 is a plan view of the light pattern actually transmitted by the mask of FIG. 5 in the presence of three-leaf aberration.

Although openings 53 are too small to form features, they are large enough that their presence breaks up the three-fold symmetry of mask 50. In the example above, this was true as long as the dimensions of the openings were at least between about 70 nm and about 80 nm. FIG. 6 shows the diffraction pattern 60 produced when light is passed through mask 50. As can be seen, diffraction pattern 60 is substantially identical to diffraction pattern 40 without the features 41 resulting from three-fold symmetry. And as seen in FIG. 7, the resulting light pattern 70 that would be imaged onto a semiconductor wafer, even in the presence of three-leaf aberration, is substantially identical to pattern 20 of FIG. 2, without the distortions shown in FIG. 3.

Figure 8:
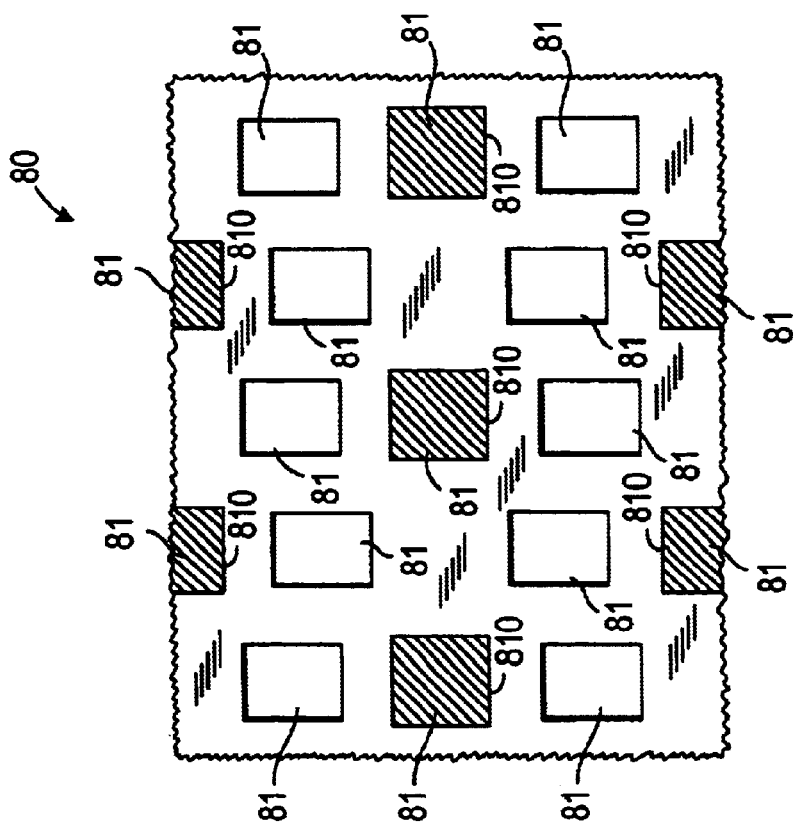
FIG. 8 is plan view of another preferred embodiment of a semiconductor pattern mask according to the present invention.

In another preferred embodiment 80, as shown in FIG. 8, instead of providing additional openings, such as openings 53, particular ones 810 of openings 81 (similar to openings 12, 51), may be provided in such a way that the phase of light transmitted through them is altered. For example, a lens, filter or other optical element 84 that changes the relative phase, or the intensity or amplitude, of light passing through it could be provided at each feature 810. The degree to which the transmissivity of features 810 can or should be changed depends in part on the photosensitivity of the photoresist material. While these features 810 participate in the formation of structures on the semiconductor wafer, they also break up the three-fold symmetry.

Figure 9:
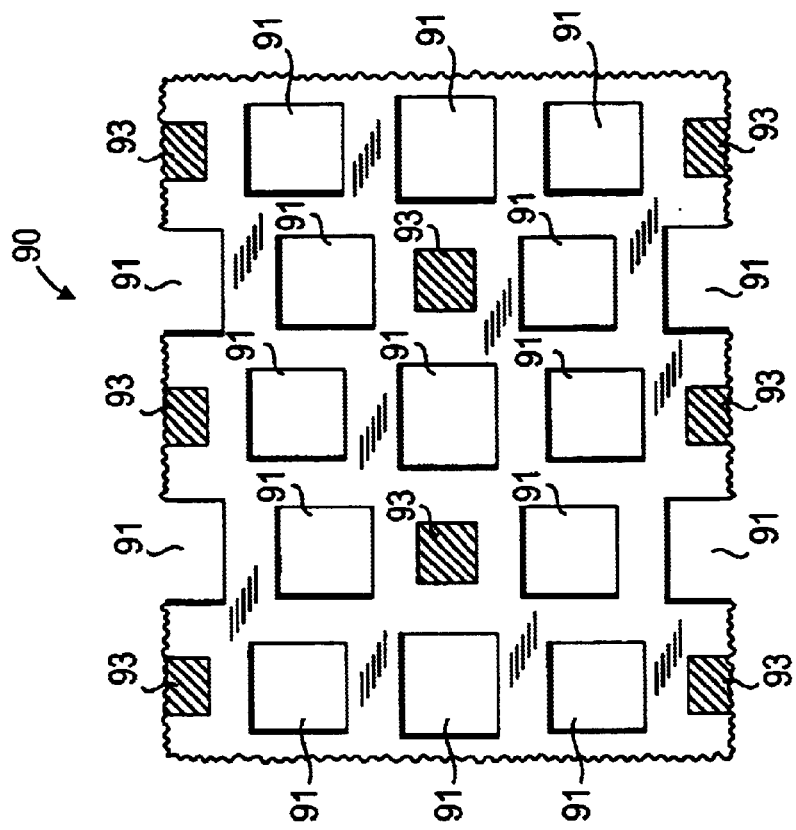
FIG. 9 is a plan view of a third preferred embodiment of a semiconductor pattern mask according to the present invention.

Moreover, in yet another preferred embodiment shown in FIG. 9, a pattern 90 can be used in which features 93 for breaking up the three-fold symmetry have smaller dimensions than openings 91 and also provided in such a way that the phase of light transmitted through them is altered.

Thus it is seen that a semiconductor pattern mask whose sensitivity to three-leaf aberration is reduced or eliminated is provided. One skilled in the art will appreciate that the present invention can be practiced by other than the described embodiments, which are presented for purposes of illustration and not of limitation, and the present invention is limited only by the claims which follow.

What is claimed is:

1. A semiconductor pattern mask comprising:
a mask substrate characterized by a first transmissivity to light; and
a plurality of features in a dense nonuniform repetitive pattern on said mask substrate for forming structures in a semiconductor pattern, said dense nonuniform repetitive pattern exhibiting three-fold symmetry; wherein:
each feature in a first portion of said features is characterized by a second transmissivity to light;
each feature in a second portion of said features is characterized by a third transmissivity to light, each feature in said second portion being different from each feature in said first portion; and
features in said second portion of said features are selected to be located relative to features in said first portion of said features such that said three-fold symmetry of said dense nonuniform repetitive pattern is broken.

2. The semiconductor pattern mask of claim 1 wherein three-fold symmetry is broken without surrounding each feature in said first portion of said features with features in said second portion of said features.

3. The semiconductor pattern mask of claim 1 wherein said first transmissivity is substantially opaque and said second transmissivity is substantially transmissive.

4. The semiconductor pattern mask of claim 1 wherein said first transmissivity is substantially transmissive and said second transmissivity is substantially opaque.

5. The semiconductor pattern mask of claim 1 wherein:
said third transmissivity is substantially equal to said second transmissivity; and
each feature in said second portion is different from each feature in said first portion in that each of said second features is smaller than any of said first features, said second features not forming structures in said semiconductor pattern.

6. The semiconductor pattern mask of claim 5 wherein:
each of said first features has dimensions selected to be imaged by light having a predetermined wavelength; and
each of said second features has dimensions substantially less than said predetermined wavelength.

7. The semiconductor pattern mask of claim 6 wherein each of said second features has dimensions of between about one-third and about one-half of said predetermined wavelength.

8. The semiconductor pattern mask of claim 1 wherein each feature in said second portion is different from each feature in said first portion in that said second and third transmissivities differ in relative phase.

9. The semiconductor pattern mask of claim 8 wherein each of said second features is at least similar in size to said first features, said second features forming structures in said semiconductor pattern.

10. The semiconductor pattern mask of claim 8 wherein each of said second features is smaller than any of said first features, said second features not forming structures in said semiconductor pattern.

* * * * *